United States Patent
Puscasu et al.

(10) Patent No.: US 9,503,039 B2
(45) Date of Patent: Nov. 22, 2016

(54) TRIMMING METHOD FOR CURRENT SENSE AMPLIFIERS

(71) Applicant: SEMICONDUCTOR COMPONENTS INDUSTRIES, LLC, Phoenix, AZ (US)

(72) Inventors: Razvan Puscasu, Targoviste (RO); Cornel D. Stanescu, Bucharest (RO); Laurentiu O. Creosteanu, Voluntari (RO); Pavel Brinzoi, Bucharest (RO)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/967,529

(22) Filed: Dec. 14, 2015

(65) Prior Publication Data
US 2016/0173037 A1 Jun. 16, 2016

Related U.S. Application Data

(63) Continuation of application No. 14/668,809, filed on Mar. 25, 2015.

(60) Provisional application No. 62/092,004, filed on Dec. 15, 2014.

(51) Int. Cl.
| H03F 3/45 | (2006.01) |
| H03F 3/21 | (2006.01) |
| H03F 1/52 | (2006.01) |
| H03F 1/02 | (2006.01) |

(52) U.S. Cl.
CPC ........ *H03F 3/45748* (2013.01); *H03F 1/0205* (2013.01); *H03F 1/523* (2013.01); *H03F 3/211* (2013.01); *H03F 3/45179* (2013.01); *H03F 3/45273* (2013.01); *H03F 3/45381* (2013.01); *H03F 2003/45022* (2013.01); *H03F 2200/261* (2013.01); *H03F 2200/444* (2013.01); *H03F 2200/462* (2013.01); *H03F 2203/45116* (2013.01); *H03F 2203/45118* (2013.01); *H03F 2203/45528* (2013.01); *H03F 2203/45571* (2013.01); *H03F 2203/45594* (2013.01); *H03F 2203/45674* (2013.01)

(58) Field of Classification Search
CPC .......................... H03F 3/45179; H03F 1/0205
USPC ...................... 330/9, 86, 258, 259, 260, 282
See application file for complete search history.

(56) References Cited

U.S. PATENT DOCUMENTS

| 4,100,437 A * | 7/1978 | Hoff, Jr. | .................. G05F 3/247 330/282 |
| 5,498,984 A | 3/1996 | Schaffer | |

(Continued)

*Primary Examiner* — Khanh V Nguyen
(74) *Attorney, Agent, or Firm* — Krueger Iselin LLP

(57) ABSTRACT

A method for adjusting common mode rejection ratio (CMRR) and gain error of a current sense (CS) amplifier, comprising: measuring a first referred to input (RTI) offset voltage while presenting a given common mode (CM) input voltage; adding a first trim resistor of a plurality of selectable trim resistors within an adjustable feedback resistor chain to a feedback electrical path; measuring a second RTI offset voltage while presenting the given CM input voltage; estimating, based upon the first and second RTI offset voltages, a third RTI offset voltage value that would result by adding a second trim resistor of the plurality of selectable trim resistors to the feedback electrical path; using the first, second and third RTI offset voltage values to identify the combination of selectable trim resistors that achieves an RTI offset voltage closest to zero volts; and adding the identified selectable trim resistors to the feedback electrical path.

19 Claims, 12 Drawing Sheets

(56) References Cited

U.S. PATENT DOCUMENTS

| | | |
|---|---|---|
| 5,585,746 A | 12/1996 | Franke |
| 5,627,494 A | 5/1997 | Somerville |
| 5,990,743 A | 11/1999 | Gabara |
| 6,819,170 B1 | 11/2004 | Kindt |
| 6,956,727 B1 | 10/2005 | Brokaw |
| 7,629,848 B2 | 12/2009 | Wu |
| 7,671,677 B2 | 3/2010 | Kindt et al. |
| 7,948,199 B2 * | 5/2011 | Li .............. H03F 3/45 330/258 |
| 8,497,791 B2 * | 7/2013 | Okumura ............ H03F 3/45475 330/86 |
| 2006/0017508 A1 * | 1/2006 | Lenz ................ H03H 7/06 330/282 |

\* cited by examiner

TRIMMING METHOD FOR CURRENT SENSE AMPLIFIERS

CROSS-REFERENCE TO RELATED APPLICATIONS

This application claims priority to Provisional U.S. Application Ser. No. 62/092,004, titled "Current Sense Amplifier with Extended Input Voltage Range and Precision Adjustment" and filed Dec. 15, 2014 by L. O. Creoșteanu, R. Pușcașu, P. Brînzoi, C. Stănescu and N. Borțun, which is hereby incorporated herein by reference. This application also claims priority to U.S. application Ser. No. 14/668,809, titled "Current Sense Amplifier With Extended Common Mode Input Voltage Range" and filed Apr. 14, 2015 by L. O. Creoșteanu, R. Pușcașu, P. Brînzoi, and N. Borțun, which is hereby incorporated herein by reference.

BACKGROUND

Current sense amplifiers are used in a wide variety of applications, including automotive, power supply, computing, medical, telecommunications, industrial and wireless applications. A current sense amplifier monitors the current flowing through a load within a circuit. Monitoring may be classified as low side sensing, where the sense amplifier detects the voltage across a resistor coupled between the load and ground, or as high side sensing, where the sense amplifier detects the voltage across a resistor coupled between the supply rail and the load.

One design constraint that affects sense amplifiers used in high side sensing is the maximum allowable common mode (CM) voltage present at the input of the amplifiers (i.e., a voltage of equal magnitude applied to both amplifier inputs resulting in a differential input voltage of zero). This is because high side sensing configurations can expose the amplifier inputs to much higher common mode voltages than those typically present in low side configurations, which can damage or destroy the amplifier's input devices if the applied voltage exceeds their limits. Designing and manufacturing a sense amplifier that is accurate and sensitive with a low referred to input (RTI) offset voltage (i.e., the output offset voltage divided by the amplifier's closed-loop gain) and a high common mode rejection ratio (CMRR), equal to the ratio of the differential gain to the absolute value of the common mode gain, yet that is still capable of being subjected to high CM input voltages (including transient spikes) above the supply rail, can be challenging.

BRIEF DESCRIPTION OF THE DRAWINGS

Accordingly, there are disclosed herein one or more current sense amplifiers with extended input common mode (CM) voltage range. In the drawings.

The drawings and corresponding detailed description do not limit the disclosure; on the contrary, they provide the foundation for understanding all modifications, equivalents, and alternatives falling within the scope of the appended claims.

DETAILED DESCRIPTION

The paragraphs that follow describe one or more illustrative current sense amplifiers with an extended input voltage range, as well as systems and methods for precision adjustments of such amplifiers. An overview of an illustrative amplifier is first presented, followed by detailed descriptions of the various modules within the amplifier, including both p-type metal oxide semiconductor (PMOS) and n-type metal oxide semiconductor (NMOS)-based low voltage (LV) input modules capable of handling common mode (CM) voltages above the VDD supply rail. The operation of a summing module that combines the output of the two LV input modules is subsequently described, as is the operation of a PMOS shutdown module and an additional protection circuit providing protection against high differential voltages. Finally, various structures and methods are described that enable adjusting on-chip resistors included with the disclosed amplifier for precision adjustment of the amplifier's offset voltage and/or common mode rejection ratio (CMRR).

Figure 1A:
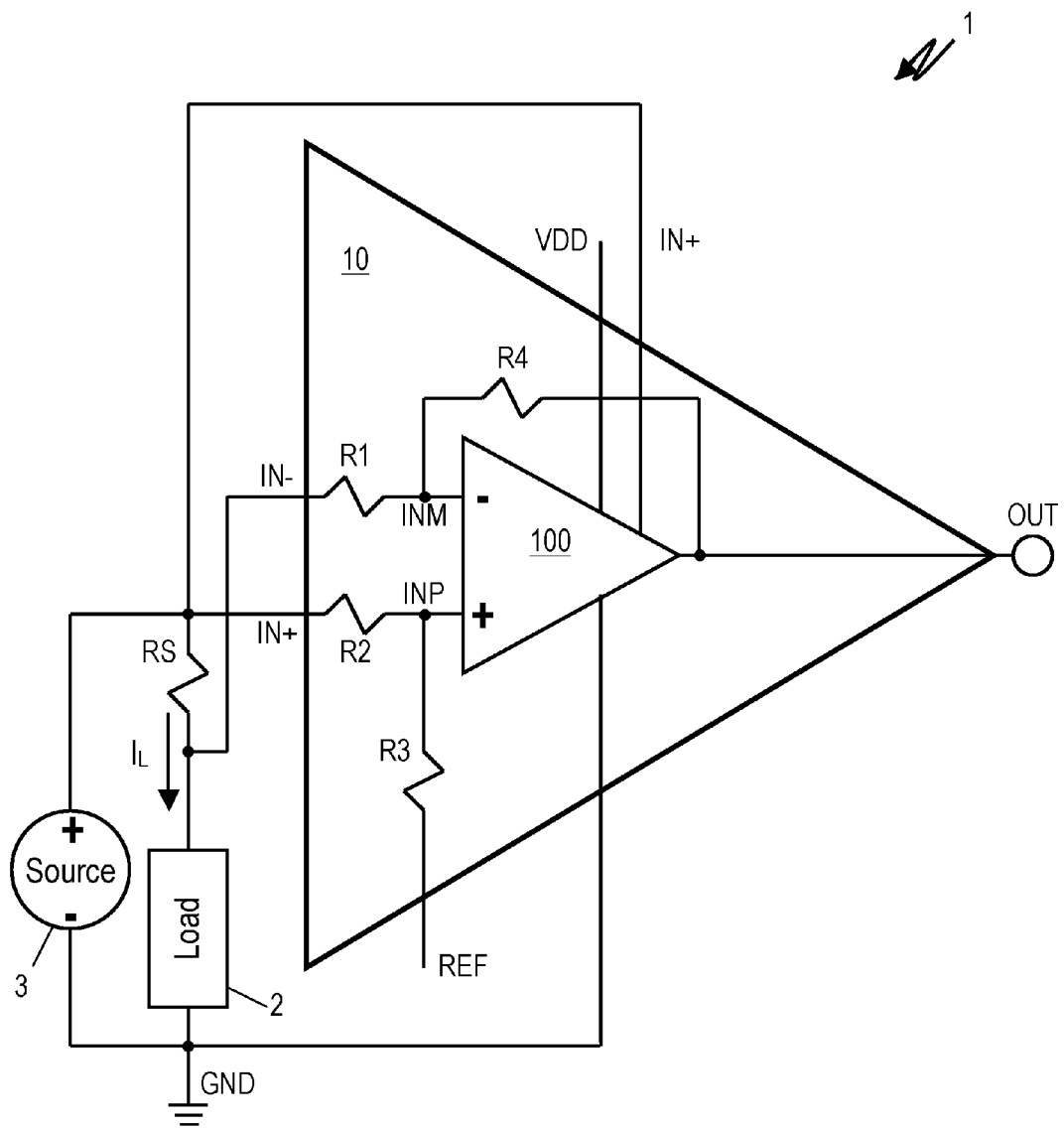
FIG. 1A is a schematic diagram of a current sense system that includes an amplifier circuit incorporating an illustrative current sense amplifier with an extended input CM voltage range.

FIG. 1A shows an example of a current sense system 1 with an integrated current sense amplifier 10. The integrated current sense amplifier 10 includes an illustrative embodiment of a differential amplifier 100 capable of tolerating common mode voltages and/or differential voltages beyond VDD and up to the limits of the semiconductor processes used to produce amplifier 10. As can be seen in the figure, both VDD and the positive input signal (IN+) provide power to amplifier 100. The integrated current sense amplifier 10 also includes resistors R1-R4, the values of which are adjusted to correct the gain, referred to input (RTI) offset voltage, and CMRR of amplifier 10 as described in more detail below. The IN+ and IN− inputs of integrated current sense amplifier 10 monitor the voltage drop across the RS resistor, which is proportional to the load current IL generated by Source 3 and flowing through Load 2. In this manner the load current IL is monitored or "sensed," enabling the current sense system 1 to provide the status of the monitored load and optionally enable other circuits to control the current provided by the source to the load. Examples of such applications of current sense system 1 include, but are not limited to, hybrid vehicle power train control systems, wireless power charging systems, electric power steering control systems and power train solenoid applications (e.g., automotive transmissions).

Figure 1B:
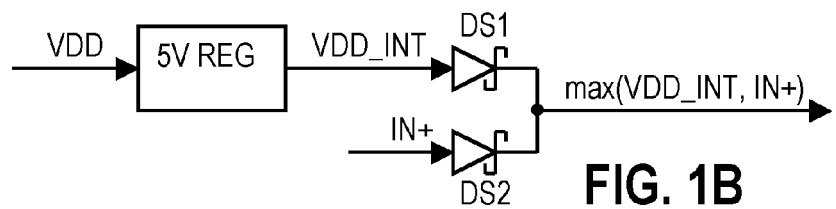
FIG. 1B is a schematic diagram of an illustrative implementation of a maximum voltage function.

As also described in more detail below, portions of differential amplifier 100 are designed to tolerate input signal voltage levels above VDD through the use of a floating power supply rail. FIG. 1B shows an illustrative embodiment of a circuit for providing the supply rail side of such a floating power source, wherein the output is the maximum between VDD_INT (a regulated version of VDD) and IN+. The Schottky diodes DS1 and DS2 provide the required isolation and selection while reducing the voltage drop across the diodes as compared to other diodes. Many similar circuits for implementing the maximum function used to produce the floating power supply rail will become apparent to those of ordinary skill in the art, and all such circuits are within the scope of the present disclosure.

Figure 1C:
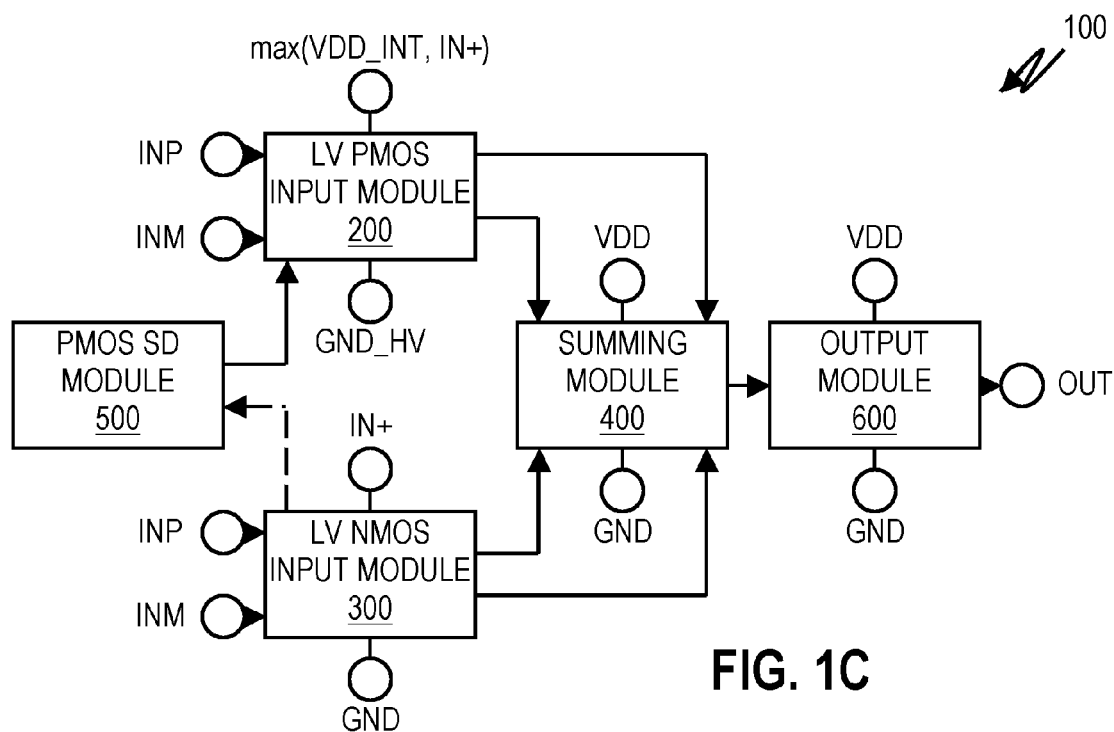
FIG. 1C is a block diagram of an illustrative current sense amplifier with an extended input CM voltage range.

FIG. 1C shows an illustrative embodiment of differential amplifier 100 of FIG. 1A, which includes two LV input modules operating as transconductance amplifiers: LV PMOS input module 200 (powered by the above-described floating power supply rail) and LV NMOS input module 300 (powered by IN+). The two input modules accept the differential input signals input-plus (INP) and input-minus (INM), which are applied to LV PMOS and LV NMOS devices, respectively. Each of the two modules is configured to operate over different but overlapping CM voltage ranges. For example, in at least some embodiments the LV PMOS input module 200 amplifies the input signals when the CM voltage is in the range between −0.3V and 1.2V, and the LV NMOS input module 300 amplifies the input signals when the CM voltage is in the range between 0.9V and the maximum process voltage (e.g., 48V, 80V, or higher voltages depending on process capabilities and application requirements). The resulting overlap between 0.9V and 1.2V corresponds to the voltage range within which the LV NMOS devices begin to conduct (i.e., at and above the threshold voltage) and the LV PMOS devices are shut down by the PMOS shutdown module (described in more detail below). Those of ordinary skill in the art will recognize that different variations of the semiconductor processes used to produce the disclosed devices can produce many other threshold voltages and overlap ranges, and all such variations are with the scope of the present disclosure.

As the CM voltage increases and the LV NMOS devices transition to an active state, a control signal is generated by PMOS shutdown (SD) module 500 that causes the devices in the LV PMOS input module 200 to transition to an inactive state over the same voltage overlap range. In at least some embodiments, an additional set of LV NMOS devices mirrors the configuration of the LV NMOS input devices of module 300 to (optionally) produce a reference signal that reflects the state of the LV NMOS input module (i.e., active, inactive or transitioning). In other illustrative embodiments, portions of the LV PMOS input module 200 are biased so as to produce a response that mirrors the inverse of the LV NMOS input module 300.

The output of both LV PMOS input module 200 and LV NMOS input module 300 are provided as inputs to summing module 400, which combines the two level shifted outputs into a single signal that is within a range between VDD and GND. This output is buffered by output module 600, producing the output signal of differential amplifier 100.

Figure 2:
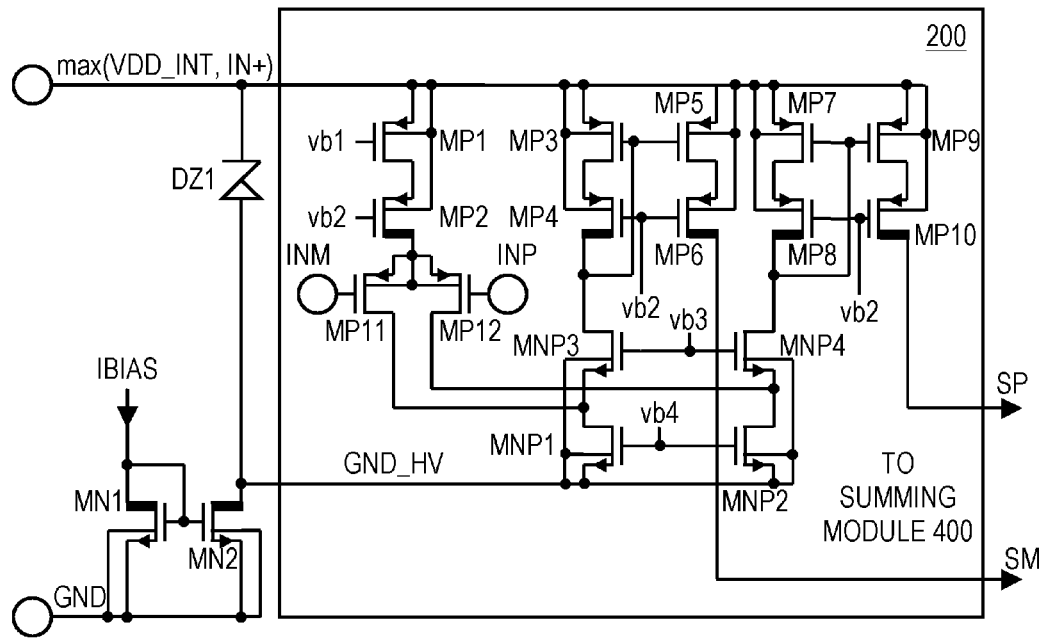
FIG. 2 is a circuit diagram of an illustrative low voltage (LV) p-type metal oxide semiconductor (PMOS) input module.

FIGS. 2-5B illustrate various embodiments of LV PMOS input module 200, LV NMOS input module 300, summing module 400 and PMOS SD module 500. Referring now to FIG. 2, an illustrative embodiment of LV PMOS input module 200 is shown, as is a circuit for producing the high voltage ground rail (GND_HV) that together with the floating power supply rail (VMAX, equal to max(VDD_INT, IN+)) maintains a constant voltage across the components of module 200 that is within the operating range of the low voltage devices of module 200 (e.g., 5V). A voltage regulator (e.g., Zener diode DZ1) provides the regulation that maintains GND_HV at the required level (e.g., VMAX−5V), while high voltage (HV) NMOS devices MN1 and MN2 operate to provide the biasing current required to operate the module. Other voltage regulator circuits and configurations suitable for generating GND_HV are known in the art (e.g., a series of diodes or Schottky diodes, or a series of diode connected MOS devices) and all such voltage regulators are within the scope of the present disclosure.

Continuing to refer to the illustrative embodiment of FIG. 2, differential input signals INM and INP are applied to LV PMOS input devices MP11 and MP12 that are coupled in a common source configuration. These input devices are each coupled to VMAX through a tail current source that includes LV PMOS device MP1 and HV PMOS device MP2, respectively driven by bias voltages vb1 and vb2. These bias voltages, together with other bias voltages used throughout differential amplifier 100, are set based upon desired operational parameters and process limits (e.g., desired amplifier open loop gain, maximum voltage limits, etc.). Techniques for determining such bias voltages are known in the art and are not discussed further.

The LV PMOS input devices MP11 and MP12 are also coupled to LV NMOS current mirrors MNP1 and MNP2, as well as to LV NMOS cascode devices MNP3 and MNP4. MNP3 and MNP4 respectively couple to LV PMOS current mirrors formed by devices MP3, MP5 and MP7, MP9. MNP3 and MNP4 also respectively couple to HV PMOS cascode devices MP4, MP6 and MP8, MP10. The gates of devices MP4, MP6, MP8 and MP10 are driven by bias voltage vb2; the gates of MNP3 and MNP4 are driven by vb3, while the gates of MNP1 and MNP2 are driven by vb4. The HV devices provide high voltage protection (e.g., at voltages above 5 volts) and level shift the output signal of the LV PMOS input module 200 to a low voltage range (e.g., 0-5V). The level shifted output differential signals SP and SM are provided as inputs to the summing module 400.

By powering the LV PMOS input module 200 with a power source that shifts with the common mode voltage present at the input of differential amplifier 100, low voltage devices can be used at the input of the module (i.e., used as the devices that accept INM and INP as their inputs). This is because the shift maintains the voltages applied to the low voltage devices (both at their input and as their power source) within the safe operating range of such devices. These low voltage devices can be manufactured using fewer processing steps and masks than high voltage devices, which results in less variability in target processing parameters (e.g., threshold voltages, transconductance gain, etc.) and better matching between devices within the amplifier as compared to high voltage devices. The high voltage devices that are used within the module have less of an impact on such parameters than they would if used as the input devices (e.g., for input devices MP1 and MP2).

Figure 3A:
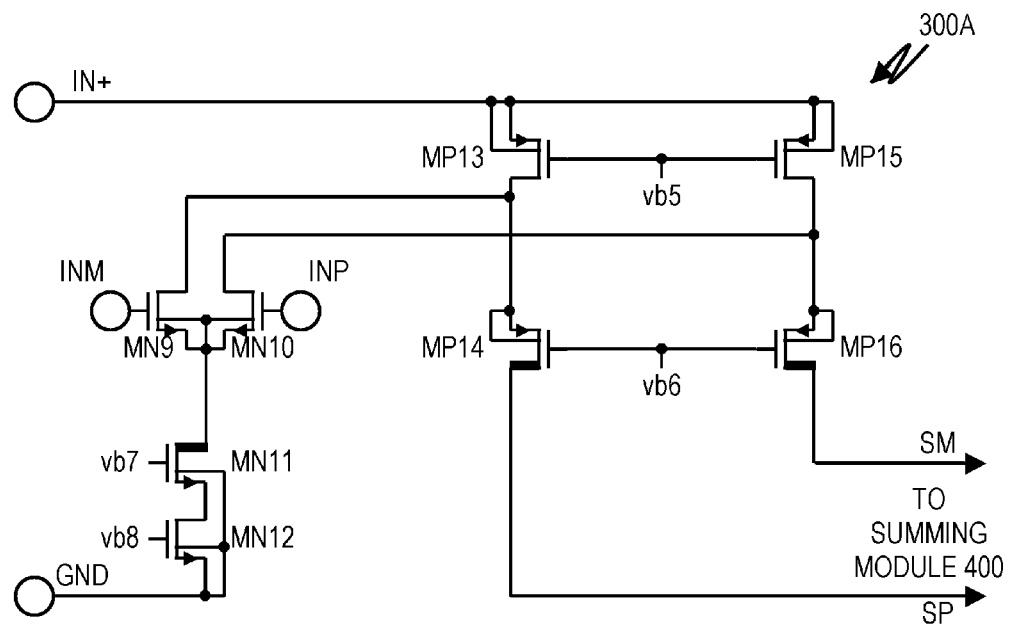
FIG. 3A is a circuit diagram of an illustrative LV n-type metal oxide semiconductor (NMOS) input module.

Referring now to FIG. 3A, an illustrative embodiment of LV NMOS input module 300 is shown as module 300A, which is powered by input signal IN+ relative to GND. The input devices of the module include LV NMOS devices MN9 and MN10, which couple to a tail current source. The tail current source includes LV NMOS device MN12 and HV NMOS cascode device MN11. High voltage device MN11 protects the low voltage devices during high voltage operations (e.g., common mode voltages greater than 5V). The LV NMOS input devices MN9 and MN10 also couple to LV PMOS current mirror devices MP13 and MP15, respectively, and to HV PMOS cascode devices MP14 and MP16, respectively. These HV devices provide high voltage protection and level shift the output signal of the LV NMOS input module 300 to a low voltage range (e.g., 0-5V). The gates of devices MP13 and MP15 are driven by bias voltage vb5, while the gates of MP14 and MP16 are driven by vb6. The gate of MN11 is driven by vb7 and the gate of MN12 is driven by vb8. As with the LV PMOS input module, the level shifted output differential signals SP and SM of the LV NMOS input module are provided as inputs to the summing module 400. The bulk contact of HV devices MP14 and MP16 is each coupled to its own source potential for proper operation at negative common mode voltages (e.g., −0.3V). This configuration prevents the PN junction formed between the drain node and the bulk from becoming forward biased. For negative input CM voltages (e.g., −0.3V), the difference between SM (SP) voltage and INP voltage is smaller than two diode forward voltages, thus prevent reverse current flow from SM (SP) to INP.

Figure 3B:
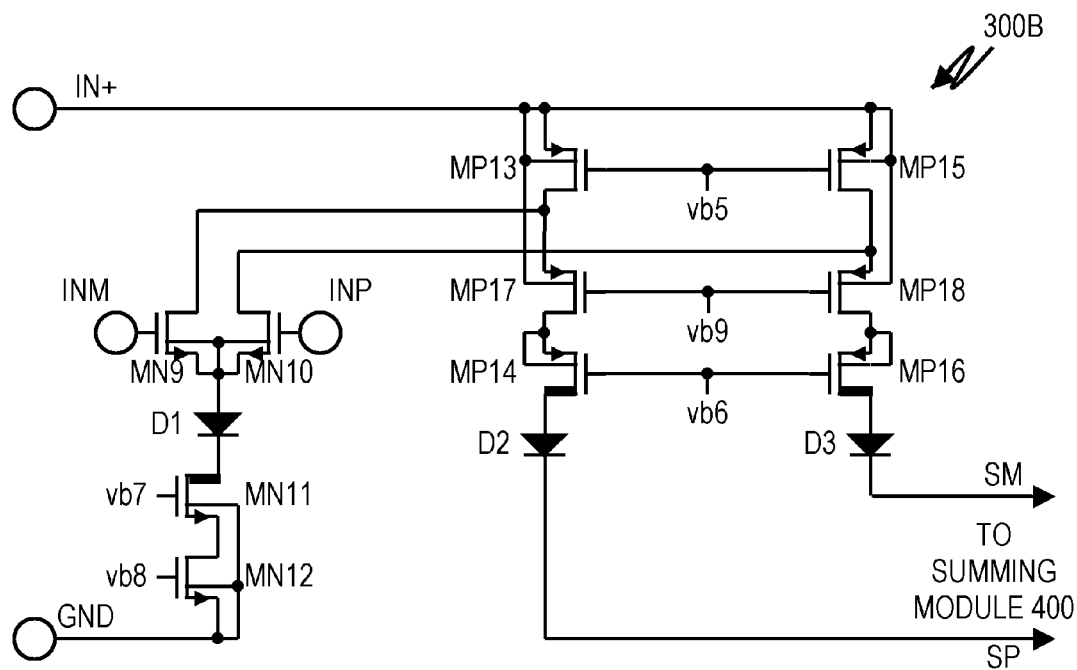
FIG. 3B is a circuit diagram of an alternative, illustrative LV NMOS input module.

FIG. 3B shows an illustrative embodiment of LV NMOS input module 300 as module 300B, which adds several devices to the embodiment of FIG. 3A. Diode D1 couples between input devices MN9/MN10 and HV NMOS cascode device MN11, while diodes D2 and D3 are coupled between HV PMOS devices MP14/MP16 and the corresponding module 300B output nodes, respectively (outputting differential signals SP and SM, respectively). These diodes, which in at least some embodiments are Schottky diodes, provide high voltage protection of the module's devices when the common mode voltage levels drop below GND (i.e., limited by the back voltage of the diodes used). Module 300B also includes additional LV PMOS devices MP17 and MP18 for improved matching. The gates of these devices are driven by bias voltage vb9. In all other regards module 300B operates in a manner similar to that described above for module 300A.

Figure 4:
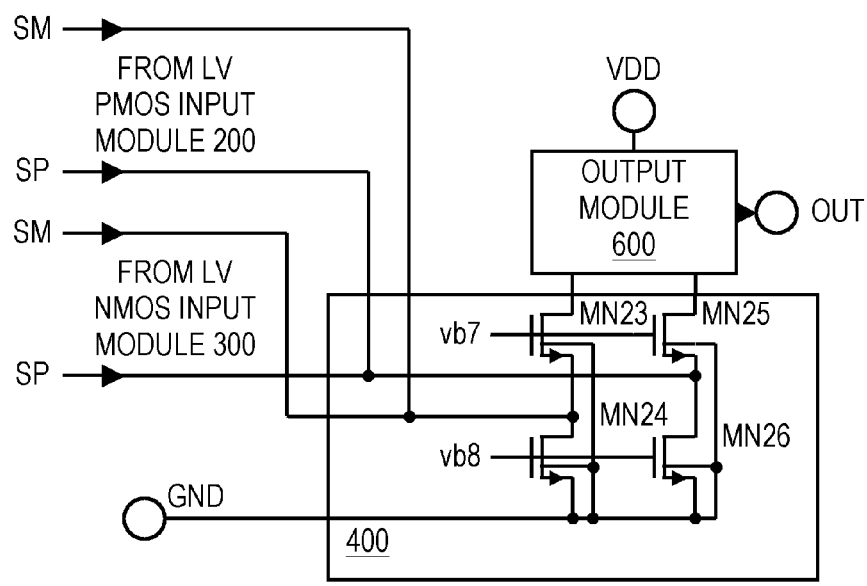
FIG. 4 is a circuit diagram of an illustrative summing module.

The output signals SM and SP of LV PMOS input module 200 and LV NMOS input module 300 are provided as differential inputs to summing module 400. FIG. 4 shows an illustrative embodiment of summing module 400. As shown, the SM and SP signals from both input modules are summed together to provide the drive signals to LV NMOS devices MN23 and MN25 respectively. The gates of MN23 and MN25 are driven by bias voltage vb7 and the gates of MN24 and MN26 are driven by bias voltage vb8. The output current of each output branch of the summing module 400 is provided as input to output module 600, which provides the output signal of differential amplifier 100. Each summing module output branch's current is proportional to the corresponding currents provided by the LV PMOS input module for a first common mode voltage range below a first threshold value (e.g., 0-0.9V); proportional to the sum of the currents provided by both the LV PMOS input module 200 and the LV NMOS input module 300 for a common mode voltage range above the first threshold value and below a second threshold value (e.g., 1.2V); and proportional to the current provided by the LV NMOS input module 300 for a common mode voltage range above the second threshold value (e.g., 1.2-80V). Because the SM and SP signals have been level shifted by both the LV NMOS and LV PMOS input modules, no additional high voltage protection is needed for the devices of the summing module 400 or the output module 600. The output signal provided by output module 600 is in range between VDD and GND (e.g., 0-5V).

Figure 5A:
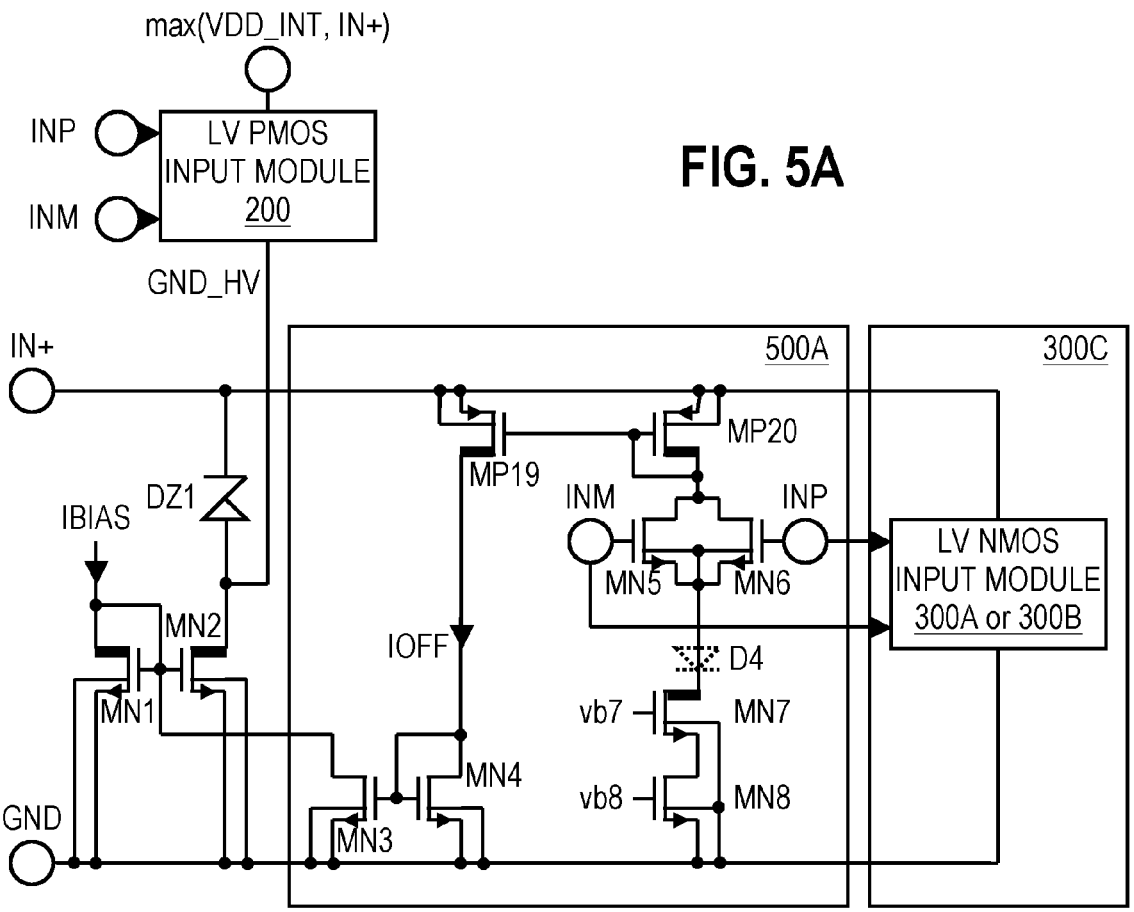
FIG. 5A is a circuit diagram of an illustrative LV PMOS shutdown module.

As previously noted, the LV PMOS input module is shut down/turned on whenever the common mode voltage transitions into a range between the above described threshold values, which is the range of values for which the LV NMOS input module turns on/turns off. PMOS SD module 500 implements this functionality and FIG. 5A shows an illustrative embodiment of the module as PMOS SD module 500A together with alternative LV NMOS input module 300C. The illustrative embodiment of modified LV NMOS input module 300C shown can include either LV NMOS input module 300A or 300B. Additional devices MP20, MN5, MN6, MN7 and MN8 (and optionally diode D4) mirror the structure of the corresponding devices of the input portion of modules 300A and 300B, thus providing a single-ended input signal that tracks the behavior of the LV NMOS input module during the common mode voltage transition range between threshold values. MN5 and MN6 are LV NMOS devices similar to MN9 and MN10 in FIG. 3A or FIG. 3B, taking into account the difference between the drain-to-source voltages introduced by the presence of MP20 device. These MN5 and MN6 devices respond to the single-ended input signal to provide a common mode feedback in the form of a "turn off" current when the CM voltage is within the transition range. The turn off current is mirrored as IOFF with the HV PMOS current mirror that includes devices MP19 and MP20. As the common mode voltage increases/decreases within the transition range, the change in IOFF causes LV NMOS current mirror devices MN3 and MN4 to increasingly/decreasingly "steal" bias current from the GND_HV rail. This bias current shift causes the LV PMOS input module to transition either to an off state or an on state, respectively by disabling/enabling the current flow through device MN2, which causes GND_HV to respectively either rise toward IN+ (disabling the LV PMOS input module 200) or fall to the regulation point of the Zener diode DZ1 (enabling module 200). Because the LV NMOS input module is transitioning on/off as the LV PMOS input module is transitioning in the opposite direction (off/on), the current provided by the two input modules combined is maintained relatively constant within the transition range, thus maintaining a relatively constant input transconductance gain ($g_m$) for differential amplifier 100.

Figure 5B:
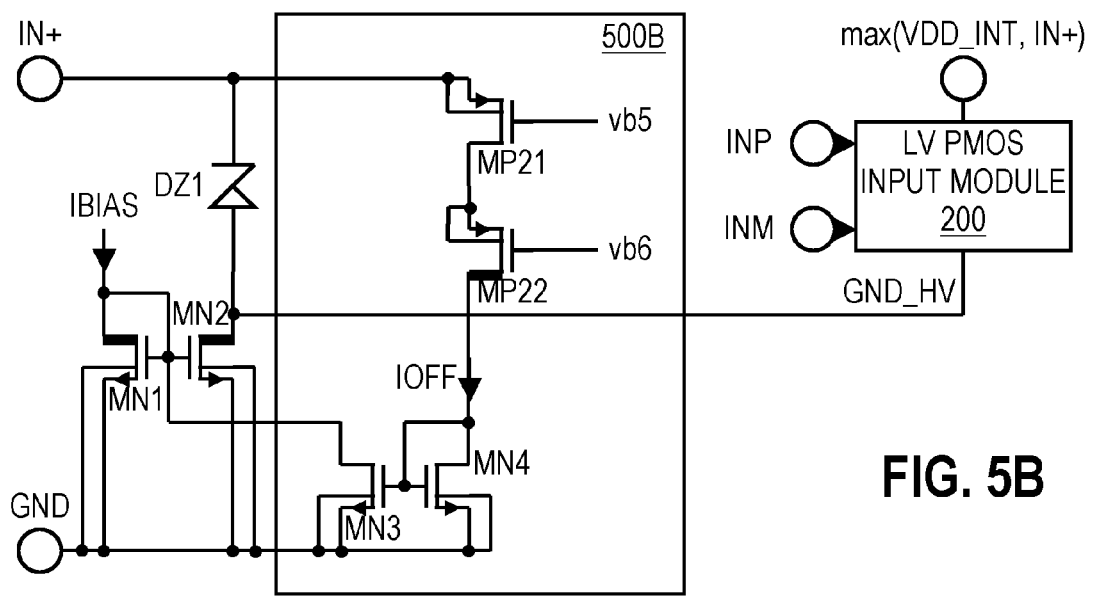
FIG. 5B is a circuit diagram of an alternative, illustrative LV PMOS shutdown module.

FIG. 5B shows an alternative embodiment of PMOS SD module 500 as module 500B. In the embodiment shown, the IOFF current is mirrored with LV PMOS current mirror MP21 and HV PMOS protection device MP22, which is matched to the shutdown/turn on characteristics of LV NMOS input module 300 by selection of the biasing voltages vb5 and vb6 applied respectively to MP21 and MP22. In all other regards, the embodiment of FIG. 5B operates in a manner similar to that described above for the embodiment of FIG. 5A.

Figure 6:
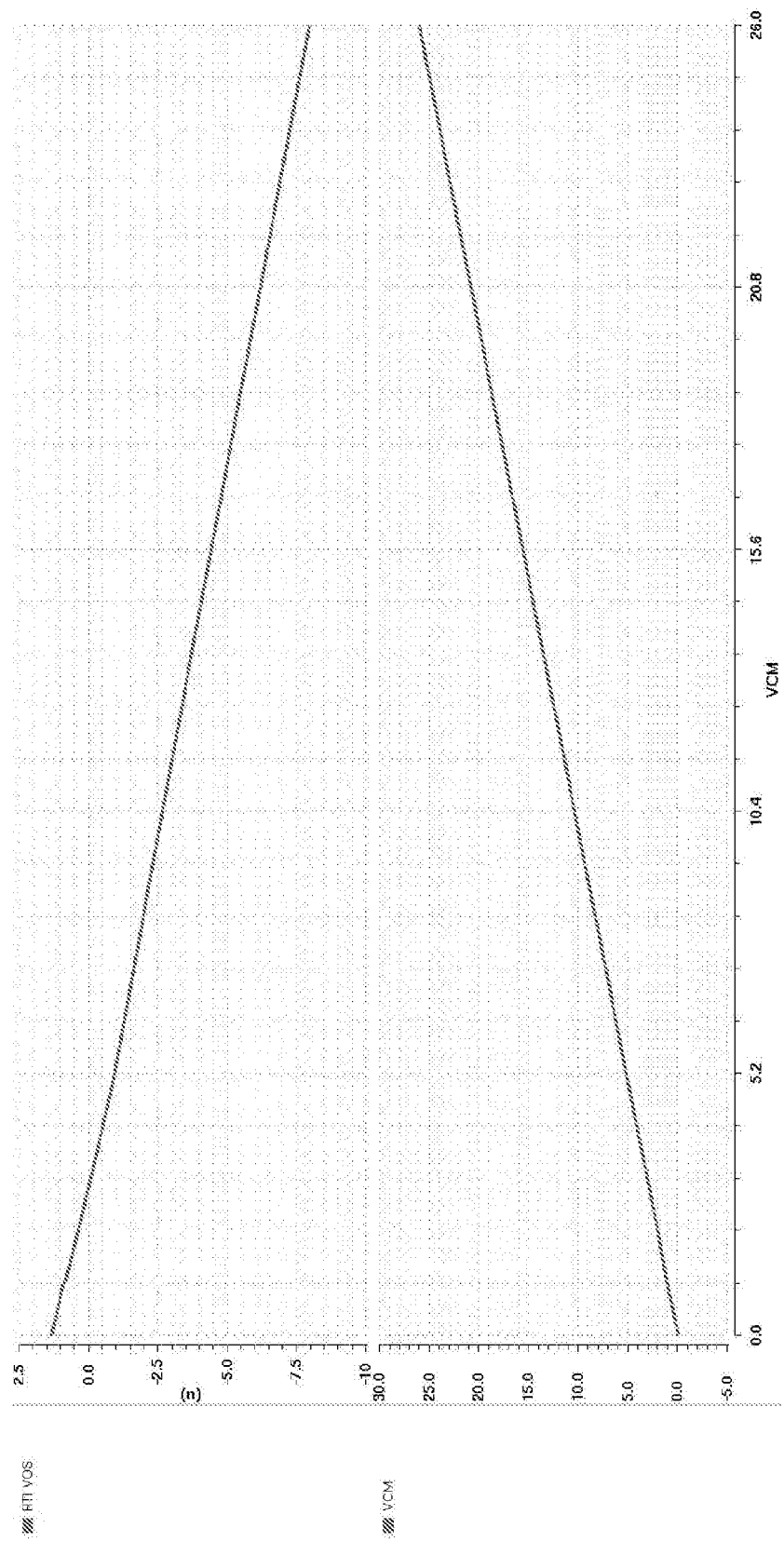
FIG. 6 is a graph showing the behavior of the RTI offset voltage of an illustrative current sense amplifier as a function of its common mode input voltage.
Figure 7:
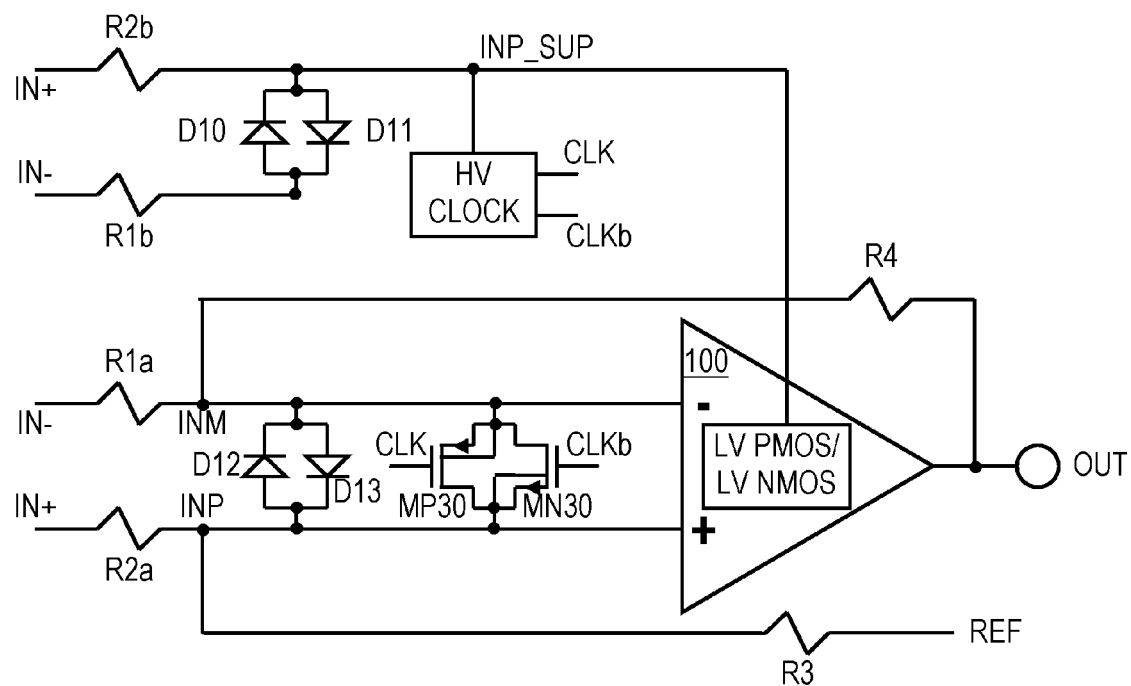
FIG. 7 is a circuit diagram of an illustrative embodiment of a differential input protection circuit.

FIG. 6 shows at the top half of the graph the RTI offset voltage of a simulated illustrative current sense amplifier 10 as a function of the common mode voltage. The lower half of the graph shows a plot of the positive input voltage (INP) as a function of the CM voltage. In addition to providing protection against high common mode voltages, at least some embodiments of the disclosed amplifier include device configurations to provide protection against high differential voltages applied at the amplifier input. FIG. 7 shows an illustrative embodiment of a differential amplifier with differential input voltage protection. In the example shown, LV MOS devices MN30 and MP30, driven by HV clock signals CLKb and CLK, provide offset voltage cancellation. To avoid applying damaging high voltages to these devices, diodes D12 and D13 operate to reduce the differential voltage range presented to the input of amplifier 100. However, this reduction, when combined with the disclosed floating power supply rails, could result in presenting damaging high voltages to the LV PMOS and LV NMOS input module devices. To account for this, the input resistors R1a and R2a and the input protection diodes D12 and D13 are duplicated with R1b, R2b, D10 and D11 to produce INP_SUP, which is a replica of the INM and INP voltages present at the amplifier inputs. INP_SUP is then used in the LV PMOS and LV NMOS input modules instead of IN+. When the differential voltage exceeds the maximum operation voltage of the LV MOS devices, INM, INP, INP_SUP, CLK & CLKB all remain within the same voltage domain. Thus, none of the LV devices of the external switches or amplifier input modules are subjected to voltages across any of their terminals that exceed their maximum operating range (e.g., 5V).

As previously noted, the use of low voltage input devices can improve the accuracy and overall performance of the disclosed differential amplifiers as compared to differential amplifiers that use high voltage input devices. This accuracy and performance can also be enhanced by more accurately setting the resistor values used to determine the gain of the amplifier. By more precisely adjusting these resistor values, the RTI offset voltage value can be reduced and the CMRR increased, resulting in an amplifier with higher sensitivity and accuracy when compared to amplifiers that do not incorporate such adjustment capabilities.

Figure 8A:
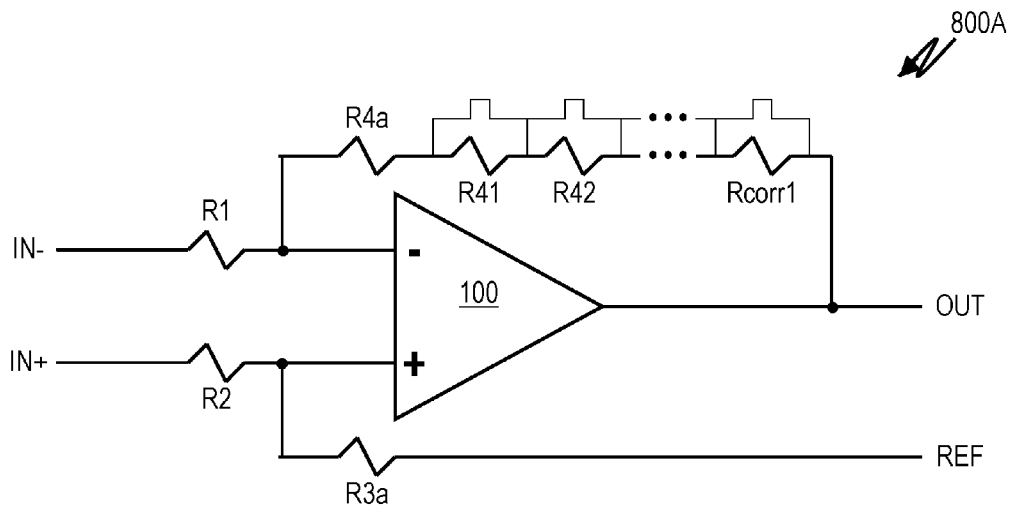
FIG. 8A is an illustrative embodiment of a trimming architecture for adjusting the CMRR of a current sense amplifier.

FIG. 8A shows an illustrative embodiment of a current sense amplifier 800A that includes a differential amplifier 100 (e.g., differential amplifier 100 of FIGS. 1-7, as previously disclosed) and a programmable resistor feedback chain for adjusting the common mode rejection ratio (CMRR) of the current sense amplifier based on a reduction of the measured RTI offset voltage. The resistor feedback chain includes a fixed resistor (R4a) that is deliberately set to a target value that, after accounting for semiconductor process variations, will be below an anticipated target value. The resistor feedback chain also includes a set of programmable/selectable trim resistors (R41, R42, Rcorr1, etc.) connected in series with each other and the fixed resistor R4a. The selectable programmable resistors are manufactured with shorting links across them that may be implemented as fusible links that can be blown (opened), for example, electrically or using a laser, or as programmable links. Such links are well known in the art and not discussed further. Each selectable programmable trim resistor is added to the feedback resistor chain by removing its corresponding shorting link.

Figure 9A:
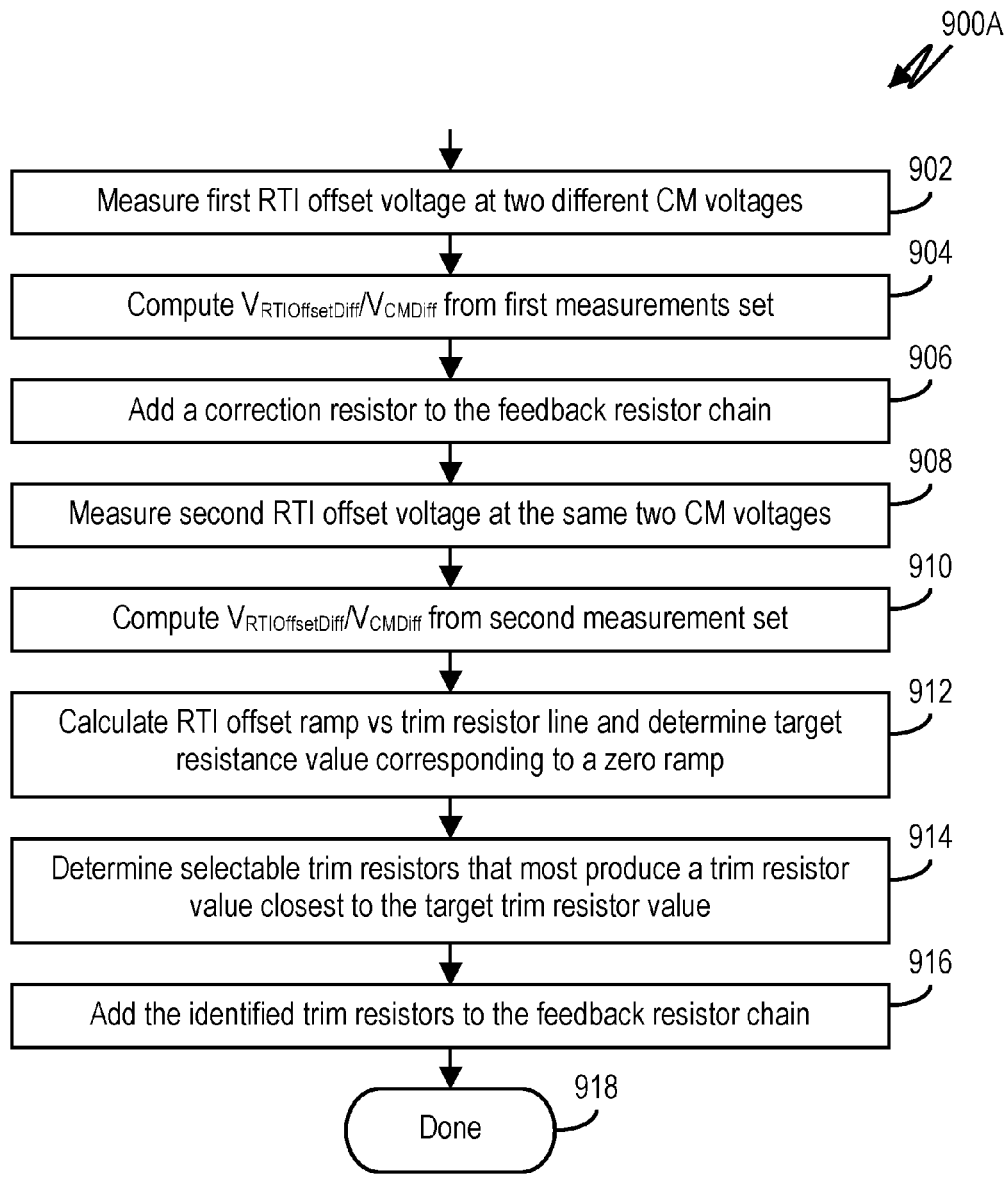
FIG. 9A is a flowchart of an illustrative method for adjusting the resistors of the trimming architecture of FIG. 8A.

FIG. 9A shows an illustrative method 900A for adjusting (trimming) the feedback resistor chain. The adjustment improves (increases) the CMRR by reducing the RTI offset voltage variation with the common mode voltage (VCM) (as compared to the offset voltage variation with VCM present without trimming). Such methods may be implemented using automated testing equipment as part of the production of embodiments of the current sense amplifier shown in FIG. 8A. A first set of RTI offset voltages are first measured using any of a variety of known methods with the initial feedback resistor chain value (i.e., R4a only) at two common mode voltages (FIG. 9A, block 902)—for example, at 0 and 12 volts. A first slope value is calculated as $(V_{OS2}-V_{OS1})/(V_{CM2}-V_{CM1})$ (block 904). Rcorr1 is then added by blowing its link (block 906), a second set of RTI offset voltages measurements are obtained at the same two common mode voltages (block 908), and a second slope value is calculated based on the second measurement set (block 910). A line equation for RTI offset ramp versus trim resistor values is calculated based on the two slope values, and the X intercept of the line is determined to identify the trim resistor value that produces an RTI offset ramp of zero (block 912). The combination of trim resistors that produces a resistor value as close as possible to the identified trim resistor value is determined (block 914) and the identified trim resistor links are blown to add them to the feedback resistor chain (block 916), ending the method (block 918).

Figure 9B:
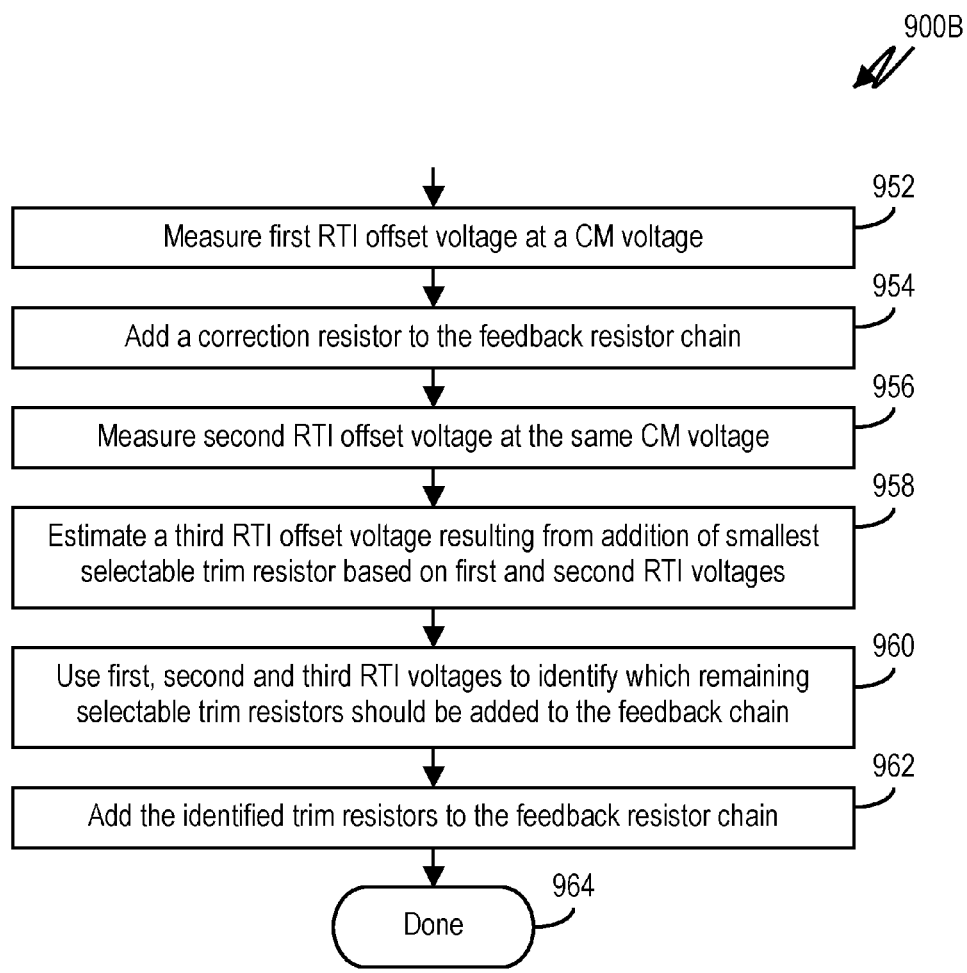
FIG. 9B is a flowchart of an alternative illustrative method for adjusting the resistors of the trimming architecture of FIG. 8A.

FIG. 9B shows an alternative illustrative method 900B for adjusting the feedback resistor chain. This adjustment also improves (increases) the CMRR based on reducing the RTI offset voltage (as compared to the offset voltage present without trimming). The method 900B requires fewer measurements per step than method 900A, decreasing the production testing time, but and is most suitable for high precision differential amplifiers with RTI offset voltages below 10 microvolts. A first RTI offset voltage is measured at a selected CM voltage, for example 26V (block 952, FIG. 9B), Rcorr1 is added by blowing its link (block 954), and a second RTI offset voltage is measured at the same CM voltage (block 956). The two measured values are then used to estimate the RTI offset voltage compensation (shift) that would result from adding to the feedback resistor chain the selectable trim resistor with the lowest resistance value (block 958). The estimated value, together with the measured values, are used to identify which selectable trim resistors should be added to the feedback resistor chain (block 960) to achieve an RTI offset voltage as close to zero as possible, given the available trim resistors, and the identified trim resistor links are blown to add them to the feedback resistor chain (block 962), ending the method (block 964). For example, in at least some illustrative embodiments the selectable trim resistors have resistance values that are multiples of other resistors in the chain. The smallest selectable trim resistor may have a target resistance of 250 Ohms, the next resistor in the chain 500 Ohms and the next 1 k Ohms, with successive selectable trim resistors having resistance values double that of the previous resistor up to a maximum value (e.g., 16 k Ohms). Thus, the contribution of each trim resistor to the RTI offset voltage can be mathematically estimated from the drop across the smallest resistor estimated based on the measured voltages. By using the measured RTI offset voltages to estimate the RTI offset voltage contribution of each selectable trim resistor, the effect processing variations have on the resistance values of the trim resistors is taken into account. A combination of selectable trim resistors may thus be achieved that produces an RTI offset voltage closer to zero than is achievable by assuming that all resistors in the feedback resistor chain have values equal to their target resistances.

Figure 8B:
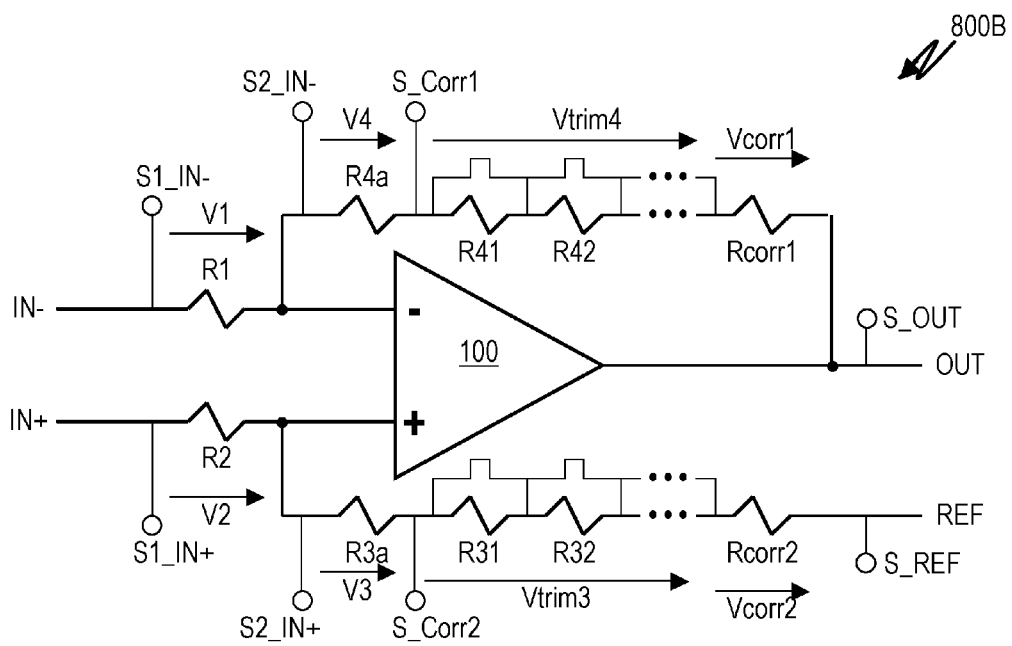
FIG. 8B is an alternative, illustrative embodiment of a trimming architecture for adjusting the gain and common mode rejection ratio (CMRR) of a current sense amplifier.
Figure 10A:
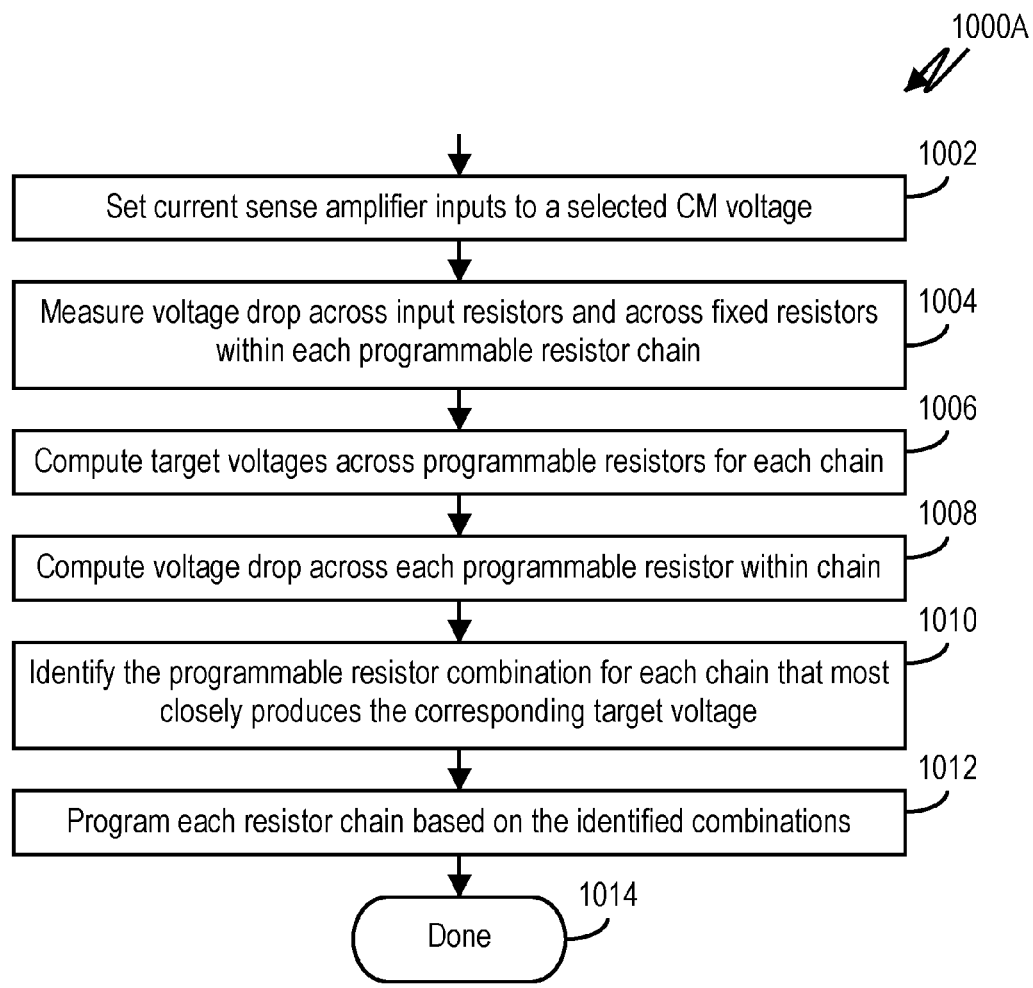
FIG. 10A is a flowchart of an illustrative method for adjusting the resistors of the trimming architecture of FIG. 8B.

As an alternative to the embodiment of FIG. 8A, FIG. 8B shows an illustrative embodiment of a current sense amplifier 800B that includes a differential amplifier 100 (e.g., differential amplifier 100 of FIGS. 1-7, as previously disclosed) and two programmable resistor chains, one on the feedback path between the output and the inverting input of the differential amplifier, the other between a reference voltage (REF) source and the non-inverting input of the differential amplifier. In at least some illustrative embodiments, the embodiment of FIG. 8B method 1000 of FIG. 10A is used as to identify which resistors of the programmable feedback and reference resistors within each corresponding chain of FIG. 8B are selected. Referring to both FIGS. 8A and 10A, the input voltages IN+ and IN− are both set to a first, same CM input voltage (block 1002), and measurements are taken across various resistors of the CS amplifier (block 1004). The voltage measurements include the voltages across measurement points S1_IN− and S2_IN− (across inverting input resistor R1), S1_IN+ and S2_IN+ (across non-inverting input resistor R2), S2_IN− and S_Corr1 (across fixed feedback resistor R4), S2_IN+ and S_Corr2 (across fixed reference resistor R3), S_Corr1 and S_OUT (across correction resistor Rcorr1), and S_Corr2 and S_OUT (across correction resistor Rcorr2).

The measured voltages are combined with the desired target common mode gain G to calculate a target voltage drop V4' across the entire programmable feedback resistor chain (R4a, R41-R4x and Rcorr1) based on gain G and the input voltage V1 across input resistor R1 (block 1006), using the equation, $$V4' = G*V1. \quad (1)$$

The desired voltage drop across the programmable section of the feedback resistor chain Vtrim4 is then computed by subtracting the drops across the fixed resistor R4 and correction resistor Rcorr1 from the target voltage drop (block 1008) as, $$Vtrim4 = V4' - V4 - Vcorr1. \quad (2)$$

A target voltage V3' and desired programmable section voltage drop Vtrim3 is similarly calculated (blocks 1006 and 1008) for the programmable reference resistor chain (R3a, R31-R3x and Rcorr2) as $$V3' = G*V2, \text{ and} \quad (3)$$

$$Vtrim3 = V3' - V3 - Vcorr2. \quad (4)$$

The desired voltage drops Vtrim4 and Vtrim3 provide a basis for determining which programmable resistors to add to each programmable resistor chain to achieve the target common mode gain G. Each resistor in the chain is of a known value. For example, in at least some illustrative embodiments R4a and R3a each has a value of just below 1 MΩ (987.5 KΩ), Rcorr1 and Rcorr2 each has a value of 10KΩ, and 6 programmable resistors in each chain have values of 0.25KΩ, 0.50KΩ, 1 kΩ, 2KΩ, 4KΩ and 8KΩ. The ratio of the resistance of each programmable resistor and the corresponding correction resistor may be used to scale the measured correction resistor voltage drop (Vcorr1 or Vcorr2) to determine the voltage drop contribution that each programmable resistor would provide if added to the chain (block 1010). This may be expressed as, $$V4x = (R4x/Rcorr1)*Vcorr1, \text{ for } x=1 \text{ to } N, \text{ and} \quad (5)$$

$$V3x = (R3x/Rcorr2)*Vcorr2, \text{ for } x=1 \text{ to } N, \quad (6)$$

where N is the number of programmable resistors in the chain.

The individual estimated voltage drops of each programmable resistor within a chain may be used to identify which resistors are selected for inclusion in the electrical path of the corresponding programmable resistor chain (block 2010). For example, each resistor may be assessed by calculating a running summation of the voltage drops contributed by each resistor, from largest to smallest. If the resulting sum exceeds the target voltage drop (Vtrim4 or Vtrim3, respectively), the resistor is not selected and not added to the summation. The resulting selections produce the programmable resistor combination for each chain that most closely produces the target voltage drops Vtrim4 and Vtrim3. Once the programmable resistors are identified, each chain (feedback and reference) are accordingly programmed (block 1012), ending the method 1000A (block 1014).

Figure 10B:
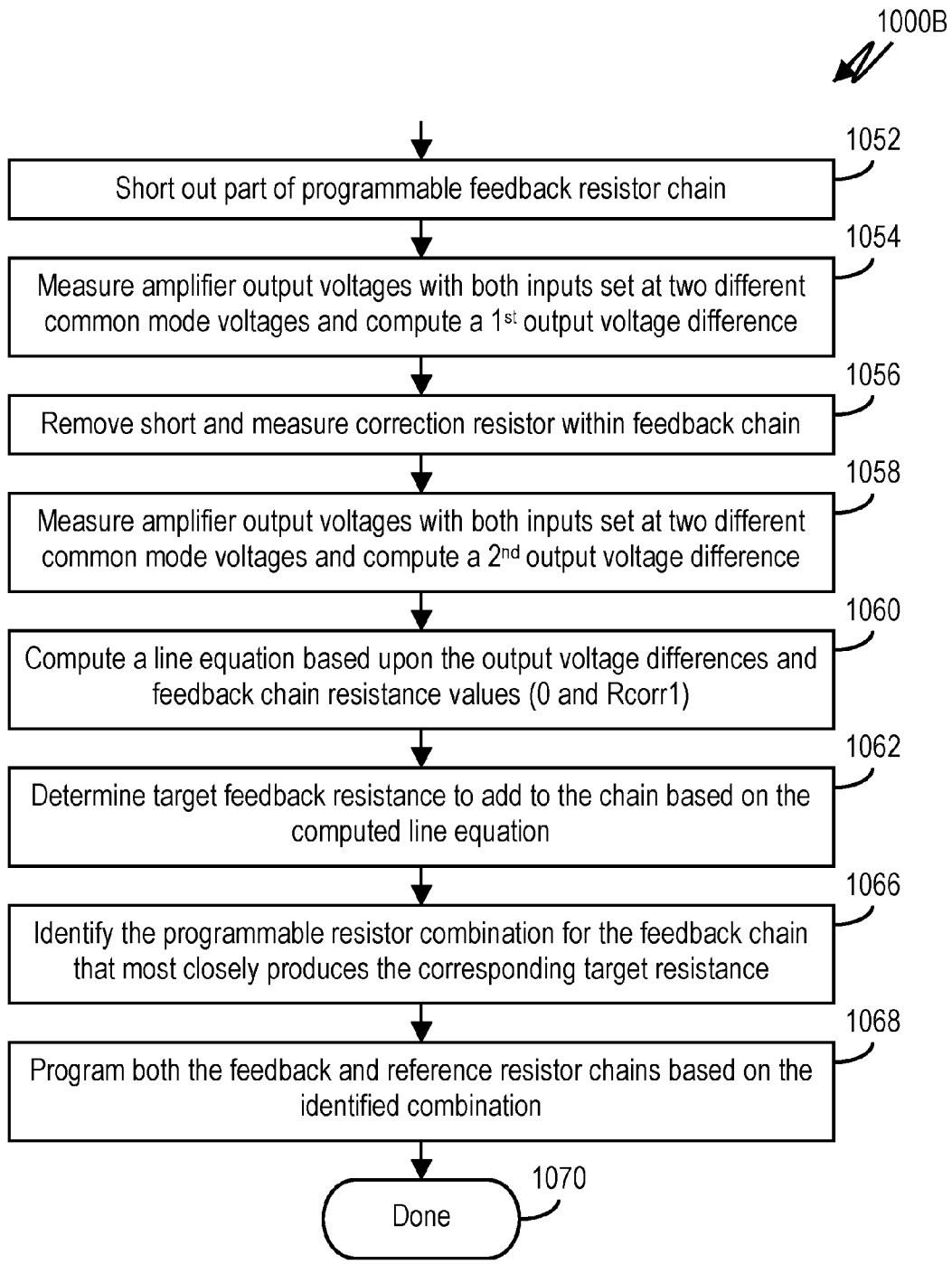
FIG. 10B is a flowchart of an alternative, illustrative method for adjusting the resistors of the trimming architecture of FIG. 8B.

FIG. 10B shows an alternative illustrative method 1000B that also may be used to identify which resistors of the programmable feedback and reference resistors within each corresponding chain of FIG. 8B are selected. Referring to both FIGS. 8B and 10B, the illustrative method 1000B begins by shorting out part of the programmable feedback resistor chain (between measurement point S_Corr1 and S_OUT), such that only R4a is present in the electrical path of the feedback resistor chain (block 1052). Output voltages of differential amplifier 100 are measured at two different common mode voltages, wherein each common mode voltage $V_{CM1}$ and $V_{CM2}$ is applied at both inputs of the current sense amplifier 800B (IN+ and IN−), and the difference of the two output voltages $V_a$ is calculated (block 1054). The short is removed and the resistance of the correction resistor Rcorr1 is measured across measurement points S_Corr1 and S_OUT (block 1056). A second set of output voltages at the same two common mode voltages ($V_{CM1}$ and $V_{CM2}$) are measured, and the difference of the second set of output voltages $V_b$ is calculated (block 1058). The two data points of resistance and output voltage differences ((0, $V_a$) and (Rcorr1, $V_b$)) are used to determine a line equation (block 1060) of the form, $$y = mx + n, \quad (7)$$

where $$m = (V_a - V_b)/(0 - Rcorr1) = (V_a - V_b)/(-Rcorr1), \text{ and} \quad (8)$$

$$n = V_a - (m*0) = V_a. \quad (9)$$

The y intercept n of the resulting line represents the resistance value of the programmable feedback resistor chain plus the correction resistor that produces no output voltage variation with changes in the common mode input voltage (block 1062). This resistance value Radd equals −n/m, but because this value includes the correction resistor, the actual trim resistor value Rtrim4=Radd−Rcorr1. The individual programmable feedback resistors within the chain that most closely produce the target Rtrim4 resistance value are identified for inclusion in the electrical path of the programmable feedback resistor chain (block 2066). For example, each resistor may be assessed by calculating a running summation of the resistance values contributed by each resistor, from largest to smallest. If the resulting sum exceeds the target resistance (Rtrim4), the resistor is not selected and not added to the summation. Once the programmable feedback resistors are identified, both chains (feedback and reference) are accordingly programmed using the same programmable resistor selections (block 1068), ending the method 1000B (block 1070).

Numerous other modifications, equivalents, and alternatives, will become apparent to those skilled in the art once the above disclosure is fully appreciated. For example, although the embodiments described present low voltage devices as devices operating between 0 and 5 volts and high voltage devices as operating at voltages below, at or above 48 volts, other operating voltage ranges may be characterized as low voltage ranges (e.g., the normal operating voltage range for a thin oxide gate MOS device) and any voltage above such a low voltage range is a high voltage for purposes of the present disclosure. All such low voltages, high voltages and voltage ranges are within the scope of the present disclosure. Further, although the selection of programmable resistors of the described embodiments is implemented using fusible links, other embodiments may use electronically controlled switches (e.g., MOSFETs controlled by memory devices, i.e., RAM, EEPROM, flash RAM, etc.) to select/program the disclosed programmable resistors. It is intended that the following claims be interpreted to embrace all such modifications, equivalents, and alternatives where applicable.

What is claimed is:

1. A method for adjusting a current sense (CS) amplifier, increasing a common mode rejection ratio (CMRR) and reducing a gain error of the CS amplifier as compared to an unadjusted CS amplifier, the method comprising:

measuring a first referred to input (RTI) offset voltage while presenting a given common mode (CM) input voltage to both an inverting input and a non-inverting input of the CS amplifier;

adding a first trim resistor of a plurality of selectable trim resistors within an adjustable feedback resistor chain to a feedback electrical path of the adjustable feedback resistor chain, said adjustable feedback resistor chain coupling an output of a differential amplifier within the CS amplifier to an inverting input of the differential amplifier;

measuring, after adding the first trim resistor, a second RTI offset voltage while presenting the given CM input voltage to both the inverting input and the non-inverting input of the CS amplifier;

estimating, based upon the first and second RTI offset voltages, a third RTI offset voltage value that would result by adding a second trim resistor of the plurality of selectable trim resistors to the feedback electrical path;

using the first, second and third RTI offset voltage values to identify the combination of selectable trim resistors that achieves an RTI offset voltage closest to zero volts as compared to other combinations of selectable trim resistors; and adding the identified selectable trim resistors to the feedback electrical path.

2. The method of claim 1, wherein each of said selectable trim resistors is provided with a shorting link, and wherein adding the identified selectable trim resistors comprises severing one or more of said shorting links.

3. The method of claim 1, wherein the second trim resistor comprises a trim resistor with a smallest resistance value as compared to other trim resistors of the plurality of selectable trim resistors.

4. A method for adjusting a current sense (CS) amplifier, increasing a Common Mode Rejection Ratio (CMRR) and reducing a gain error of the CS amplifier as compared to an unadjusted CS amplifier, the method comprising:

computing a first slope as a difference of a first set of two measured referred to input (RTI) offset voltages divided by the difference of two different common mode (CM) input voltages at which each RTI offset voltage of the first set was measured;

adding one of a plurality of selectable trim resistors to an adjustable feedback resistor chain coupling an output of a differential amplifier within the CS amplifier to an inverting input of the differential amplifier;

computing a second slope as a difference of a second set of two measured RTI offset voltages divided by the difference of the two different CM input voltages at which each RTI offset voltage of the second set was measured;

calculating a line equation for slope versus trim resistance values and determining a target trim resistance value corresponding to a slope value of zero;

identifying selectable trim resistors producing a trim resistance value as close as possible to the target trim resistance value, given the selectable trim resistors available in the adjustable feedback resistor chain; and adding the identified selectable trim resistors to the adjustable feedback resistor chain.

5. The method of claim 4, wherein each of the selectable trim resistors is provided with a shorting link, and wherein adding the identified selectable trim resistors comprises severing one or more of said shorting links.

6. A method for adjusting a current sense (CS) amplifier, increasing a common mode rejection ratio (CMRR) and reducing a gain error of the CS amplifier as compared to an unadjusted CS amplifier, the CS amplifier comprising a differential amplifier, and the method comprising:

setting a non-inverting CS amplifier input node and an inverting CS amplifier input node to a same common mode voltage;

measuring a first input voltage across a first input resistor coupled between an inverting differential amplifier input node and the inverting CS amplifier input node;

computing a target feedback trim voltage across a plurality of programmable feedback resistors within a feedback resistor chain based on a target CS amplifier gain and the first input voltage, said feedback resistor chain coupled between the inverting differential amplifier input node and a differential amplifier output node;

computing a voltage across each of the plurality of programmable feedback resistors based on a resistance value ratio of each corresponding programmable feedback resistor and a first fixed feedback resistor within the feedback resistor chain;

identifying a first combination comprising one or more programmable feedback resistors that produces a voltage drop closest to the target feedback trim voltage as compared to other combinations, said identifying based on the computed programmable feedback resistor voltages; and selecting the one or more programmable feedback resistors identified within the first combination for inclusion in an electrical path of the feedback resistor chain.

7. The method of claim 6, wherein computing the target feedback trim voltage Vtrim4 comprises computing the value of the following equation, $$V\text{trim}4 = (G*V1) - V4 - V\text{corr}1,$$

where:

G is the target CS amplifier gain;

V1 is the first input voltage;

V4 is a voltage across a second fixed feedback resistor within the programmable feedback resistor chain; and Vcorr1 is a voltage across the first fixed feedback resistor.

8. The method of claim 6, wherein computing a voltage across each of the plurality of programmable feedback resistors comprises scaling a voltage measured across the first fixed feedback resistor according to the following equation, $$V4x = Vcorr1*(R4x/Rcorr1), x=1 \text{ to } N,$$

where:
R4$x$ is the resistance of a programmable feedback resistor $x$ of the plurality of programmable feedback resistors;
Rcorr1 is the resistance of the first fixed feedback resistor;
V4$x$ is a voltage across the programmable feedback resistor R4$x$;
Vcorr1 is a the voltage across the first fixed feedback resistor; and
N is the number of programmable feedback resistors within the programmable feedback resistor chain.

9. The method of claim 6, wherein each of the programmable feedback resistors is provided with a shorting link, and wherein selecting the programmable feedback resistors comprises severing one or more of said shorting links.

10. The method of claim 6, further comprising:
measuring a second input voltage across a second input resistor coupled between a non-inverting differential amplifier input node and the non-inverting CS amplifier input node;
computing a target reference trim voltage across a plurality of programmable reference resistors within a reference resistor chain based on the target CS amplifier gain and the second input voltage, said reference resistor chain coupled between the non-inverting differential amplifier input node and a reference voltage source;
computing a voltage across each of the plurality of programmable reference resistors based on a resistance value ratio of each corresponding programmable reference resistor and a first fixed reference resistor within the reference resistor chain;
identifying a second combination comprising one or more programmable reference resistors that produces a voltage drop closest to the target reference trim voltage as compared to other combinations, said identifying based on the computed programmable reference resistor voltages; and
selecting the one or more programmable reference resistors identified within the second combination for inclusion in an electrical path of the reference resistor chain.

11. The method of claim 10, wherein computing the target reference trim voltage Vtrim3 comprises computing the value of the following equation, $$Vtrim3 = (G*V2) - V3 - Vcorr2,$$

where:
G is the target CS amplifier gain;
V2 is the second input voltage;
V3 is a voltage across a second fixed reference resistor within the programmable reference resistor chain; and
Vcorr2 is a voltage across the first fixed reference resistor.

12. The method of claim 10, wherein computing a voltage across each of the plurality of programmable reference resistors comprises scaling a voltage measured across the first fixed reference resistor according to the following equation, $$V3x = Vcorr2*(R3x/Rcorr2), x=1 \text{ to } N,$$

where:
R3$x$ is the resistance of a programmable reference resistor $x$ of the plurality of programmable reference resistors;
Rcorr2 is the resistance of the first fixed reference resistor;
V3$x$ is a voltage across the programmable reference resistor R3$x$;
Vcorr2 is a the voltage across the first fixed reference resistor; and
N is the number of programmable reference resistors within the programmable reference resistor chain.

13. The method of claim 10, wherein each of the programmable reference resistors is provided with a shorting link, and wherein selecting the programmable reference resistors comprises severing one or more of said shorting links.

14. A method for adjusting a current sense (CS) amplifier, increasing a common mode rejection ratio (CMRR) and reducing a gain error of the CS amplifier as compared to an unadjusted CS amplifier, the CS amplifier comprising a differential amplifier and the method comprising:
connecting a short across at least part of a programmable feedback resistor chain, said programmable feedback resistor chain coupled between an inverting differential amplifier input node and a differential amplifier output node;
measuring a first set of output voltages of the differential amplifier at each of two different common mode (CM) voltages, each of the CM voltages being applied at both a non-inverting CS amplifier input node and an inverting CS amplifier input node;
removing the short and measuring a correction resistor within the programmable feedback resistor chain;
measuring a second set of output voltages of the differential amplifier at each of said CM voltages, each of the CM voltages being applied at both a non-inverting CS amplifier input node and an inverting CS amplifier input node;
computing a line equation based at least in part on output voltage differences for the first and second set of output voltages and on resistance values of at least part of the programmable feedback resistor chain with and without the short;
determining a target feedback resistance value to add to the programmable feedback resistor chain based at least in part on the computed line equation;
identifying a first combination of programmable feedback resistors that produces a resistance closest to the target feedback resistance value as compared to other combinations;
selecting one or more programmable feedback resistors identified within the first combination for inclusion in an electrical path of the programmable feedback resistor chain.

15. The method of claim 14, wherein each of the programmable feedback resistors is provided with a shorting link, and wherein selecting the programmable feedback resistors comprises severing one or more of said shorting links.

16. The method of claim 14, wherein a first output difference $V_a$ comprises the difference between an output voltage of the first set of output voltages measured at the first CM input voltage and an output voltage of the first set of output voltages measured at the second CM input voltage, wherein a second output difference $V_b$ comprises the difference between an output voltage of the second set of output voltages measured at the first CM input voltage and an output voltage of the second set of output voltages measured at the second CM input voltage, wherein one of the resistances value of the at least part of the programmable feedback resistor chain without the short comprise the resistance value of the correction resistor; and wherein the line equation is of the following form, y =mx +n,
where:
x represents resistance of said programmable feedback resistor chain;
y represents an output voltage difference resulting from said two different CM voltages;
$m=(V_a-V_b)/(-Rcorr1)$;
Rcorr1 =the correction resistor; and
$n=V_a$.

17. The method of claim 16, wherein computing the target feedback resistance value Rtrim4 comprises evaluating the following equation, $Rtrim4=(-n/m)-Rcorr1$.

18. The method of claim 14,
identifying a second combination of programmable reference resistors matching the first combination, said programmable reference resistors being part of a programmable reference resistor chain coupling a non-inverting differential amplifier input node to a reference voltage source; and
selecting one or more programmable reference resistors identified within the second combination for inclusion in an electrical path of the programmable reference resistor chain.

19. The method of claim 18, wherein the programmable reference resistors are each provided with a shorting link, and wherein selecting the programmable reference resistors comprises severing one or more of said shorting links.

* * * * *